US012568858B2

(12) United States Patent
Kamgaing

(10) Patent No.: US 12,568,858 B2
(45) Date of Patent: Mar. 3, 2026

(54) SECONDARY DIE WITH A GROUND PLANE FOR STRIP LINE ROUTING

(71) Applicant: Intel Corporation, Santa Clara, CA (US)

(72) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 17/845,835

(22) Filed: Jun. 21, 2022

(65) Prior Publication Data

US 2023/0411350 A1      Dec. 21, 2023

(51) Int. Cl.
| | |
|---|---|
| *H01L 25/065* | (2023.01) |
| *H01L 21/56* | (2006.01) |
| *H01L 23/31* | (2006.01) |
| *H01L 23/528* | (2006.01) |
| *H01L 23/538* | (2006.01) |

(52) U.S. Cl.
CPC ........ *H01L 25/0655* (2013.01); *H01L 21/563* (2013.01); *H01L 23/3121* (2013.01); *H01L 23/5286* (2013.01); *H01L 23/5381* (2013.01)

(58) Field of Classification Search
CPC .............. H01L 25/0655; H01L 21/563; H01L 25/0652
USPC ......................................................... 257/676
See application file for complete search history.

(56) References Cited

U.S. PATENT DOCUMENTS

| | | | | |
|---|---|---|---|---|
| 11,769,730 B2 * | 9/2023 | Beak | ........................ | H01L 25/50 257/750 |
| 2022/0246511 A1 * | 8/2022 | Chu | ...................... | H10D 62/405 |
| 2023/0047740 A1 * | 2/2023 | Cheung | ................... | H01S 5/042 |

* cited by examiner

*Primary Examiner* — Quoc D Hoang
(74) *Attorney, Agent, or Firm* — Schwabe, Williamson & Wyatt P.C.

(57) ABSTRACT

Embodiments herein relate to systems, apparatuses, or processes for packages that include a high-speed transmission line that is routed from a compute die on a substrate under a silicon die that is next to the compute die on the substrate. The silicon die includes a ground plane above the high-speed transmission line. The high-speed transmission line is at least partially between the ground plane of the silicon die and another ground plane within the substrate. Other embodiments may be described and/or claimed.

23 Claims, 8 Drawing Sheets

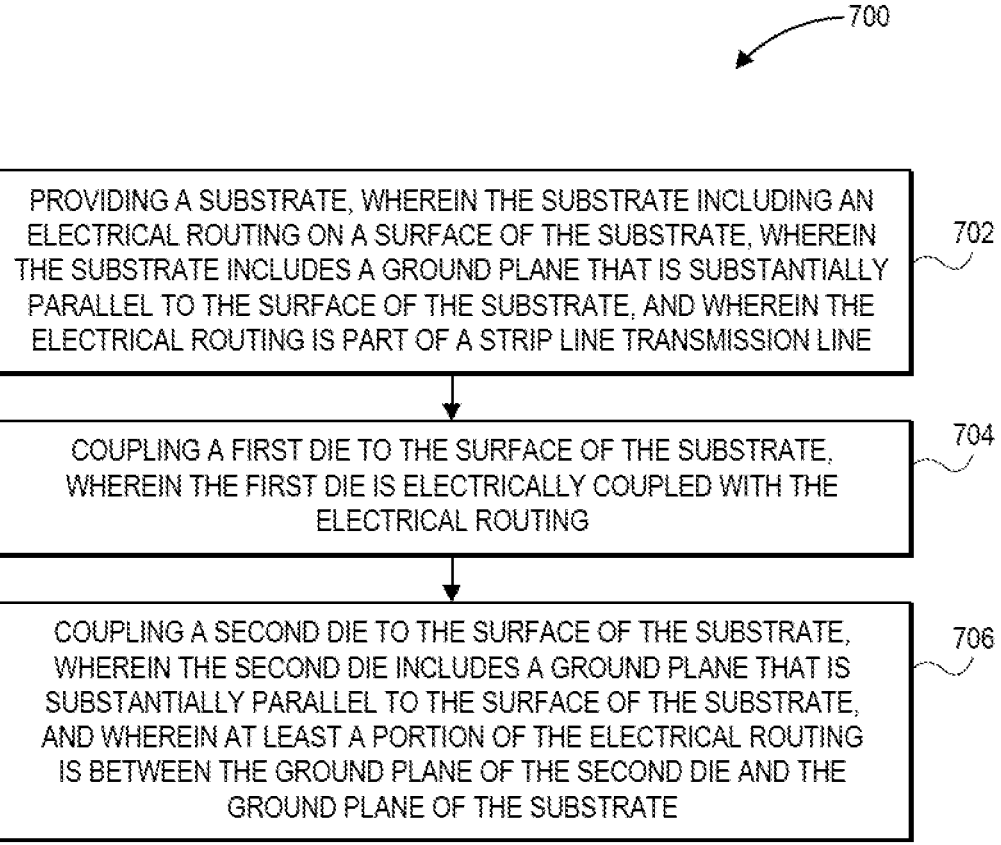

700

| PROVIDING A SUBSTRATE, WHEREIN THE SUBSTRATE INCLUDING AN ELECTRICAL ROUTING ON A SURFACE OF THE SUBSTRATE, WHEREIN THE SUBSTRATE INCLUDES A GROUND PLANE THAT IS SUBSTANTIALLY PARALLEL TO THE SURFACE OF THE SUBSTRATE, AND WHEREIN THE ELECTRICAL ROUTING IS PART OF A STRIP LINE TRANSMISSION LINE | 702 |

| COUPLING A FIRST DIE TO THE SURFACE OF THE SUBSTRATE, WHEREIN THE FIRST DIE IS ELECTRICALLY COUPLED WITH THE ELECTRICAL ROUTING | 704 |

| COUPLING A SECOND DIE TO THE SURFACE OF THE SUBSTRATE, WHEREIN THE SECOND DIE INCLUDES A GROUND PLANE THAT IS SUBSTANTIALLY PARALLEL TO THE SURFACE OF THE SUBSTRATE, AND WHEREIN AT LEAST A PORTION OF THE ELECTRICAL ROUTING IS BETWEEN THE GROUND PLANE OF THE SECOND DIE AND THE GROUND PLANE OF THE SUBSTRATE | 706 |

FIG. 7

SECONDARY DIE WITH A GROUND PLANE FOR STRIP LINE ROUTING

FIELD

Embodiments of the present disclosure generally relate to the field of package assemblies, and in particular package assemblies that include strip line transmission lines.

BACKGROUND

Continued reduction in end product size of mobile electronic devices such as smart phones and ultrabooks is a driving force for the development of reduced size system in package components. In particular, reducing layer counts of a package substrate may facilitate an overall reduction in Z-height of packages within mobile electronic devices.

BRIEF DESCRIPTION OF THE DRAWINGS

FIG. 7 illustrates an example of a process for creating a package that includes a substrate with a strip line transmission line electrically coupled with a first die, where at least a portion of the strip line is between a ground plane in the substrate and a ground plane in a second die proximate to the first die, in accordance with various embodiments.

DETAILED DESCRIPTION

Figures 1A, 1B:
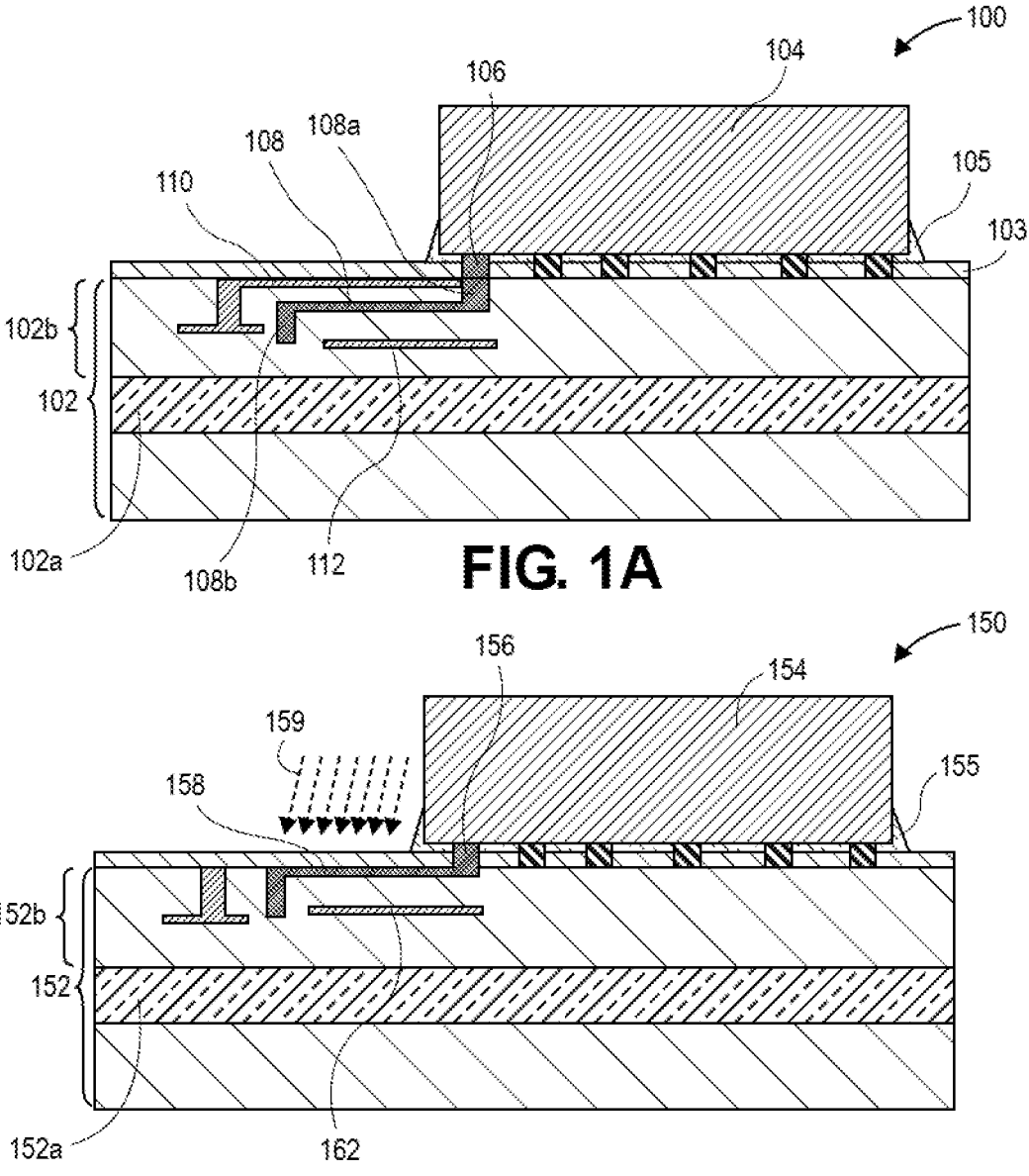
FIGS. 1A-1B illustrate a cross section side views of a legacy package that includes a strip line within a substrate for FIG. 1A and a microstrip transmission line in a substrate for FIG. 1B that is coupled with a die, and a signal line at a side of the substrate that is coupled with a die.

Embodiments of the present disclosure may generally relate to systems, apparatus, techniques, and/or processes directed to packages that include a high-speed transmission line, or communication channel, on a surface of a substrate of a package and electrically coupled with a die on the substrate. In embodiments, a secondary die, which may be referred to as a second die, a companion die, a passive silicon die, or a dummy die, may be placed adjacent to the original die with at least part of the high-speed transmission line underneath the secondary die. In embodiments, the secondary die may include a ground plane that is as a reference plane for the high-speed transmission line, thus allowing higher frequencies to be transmitted. In embodiments, another ground plane may be within the substrate beneath the high-speed transmission line.

In embodiments, when the high-speed transmission line is between the ground plane of the secondary die and the ground plane within the package substrate, a strip line structure may be formed. In embodiments, when only the ground plane of the secondary die is above the high-speed transmission line, or when the high-speed transmission line is only above the ground plane of the substrate, for example when the high-speed transmission line is between the original die in the secondary die, a microstrip structure may be formed. In embodiments, the secondary die and the die may be separated by less than 200 μm. In embodiments, the secondary die with the ground plane may be used to shield a breakout structure within the substrate.

In embodiments, using a secondary die with the ground plane may result in a strip line structure for the high-speed transmission line while only requiring one layer within the package substrate to be a ground plane. In other embodiments, the die and the secondary die may be on an interconnect that is coupled with the substrate, where a ground plane may be on the interconnect and beneath the high-speed transmission line.

In embodiments, in addition to increasing data transmission speeds of the high-speed transmission line, the strip line structure may also mitigate electromagnetic interference (EMI) or radio frequency interference (RFI) affecting the quality of the high-speed transmission line. This may be referred to as RFI immunity. In embodiments where the high-speed transmission line is between the die and the secondary die, in the form of a microstrip structure, EMI/RFI absorbing fill may be placed between the two dies and above the high-speed transmission line. This absorbing fill may absorb EMI/RFI that may be generated by the high-speed transmission line, or that may be received by the high-speed transmission line from signal generating devices outside the package. In embodiments, cross-talk may be reduced and a frequency range for the high-speed communication channel may be extended.

In legacy implementations, communication and computing platforms require high-speed communication channels between different dies, for example between a computing die and a memory die or between an input/output (I/O) hub and a compute, graphics, or memory die. These two dies may be on the same package or a different packages and require increased data transmission speed. In legacy implementations, a traditional microstrip formed on a surface of the substrate for high-speed communication may fail to meet signal integrity requirements due to exposure to EMI/RFI, where speeds and higher frequencies are increasingly required for these high-speed transmission lines.

In addition, in these legacy implementations, signals on a high-speed transmission line may be at a frequency that interferes with Wi-Fi and/or other wireless frequencies on or near the package. In these legacy implementations, to overcome these issues strip line transmission lines may often be used within the substrate. However, these implementations result in thicker packages that require additional layers for reference grounds, are more expensive to manufacture, and also require a long lead time in the package manufacturing process.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A-1B illustrate a cross section side views of a legacy package that includes a strip line within a substrate for FIG. 1A and a microstrip transmission line in a substrate for FIG. 1B that is coupled with a die, and a signal line at a side of the substrate that is coupled with a die. FIG. 1A shows a cross section side view of legacy package 100 that includes a substrate 102 that has a die 104 attached to the substrate 102. In legacy implementations, die 104 may be a compute die. Legacy substrate 102 includes core 102a and upper build-up layers 102b. The die 104 is electrically coupled through electrical connection 106 to a high-speed signal line 108 within the upper build-up layers 102b.

The high-speed signal line 108 may include a first set of one or more vias 108a that electrically couple with the electrical connection 106, and may include a second set of one or more vias 108b that may route a signal on the high-speed signal line 108 into the substrate 102 and toward the core 102a. There may be a first ground plane 110 on a surface of the substrate 102, and a second ground plane 112 within the substrate 102, which may be within the upper build-up layers 102b.

In implementations, a strip line structure is formed when the high-speed signal line 108 is between the first ground plane 110 and the second ground plane 112. As a result, the high-speed signal line 108 is able to achieve a higher quality data rate and operate at a higher frequency within the strip line structure. Although higher signal quality is achieved, it comes at the expense of additional layers within the upper build-up layer 102b needed to incorporate the first ground plane 110. A solder resist layer 103 may be on top of the substrate 102. An underfill 105 may be placed under the die 104.

FIG. 1B shows a cross section side view of legacy package 150 that includes a substrate 152 that has a die 154 attached to the substrate 152. Legacy substrate 152 includes core 152a and upper build-up layers 152b. The die 154 is electrically coupled through electrical connection 156 to a high-speed signal line 158 within the upper build-up layers 152b. A ground plane 162, which may be similar to ground plane 112 of FIG. 1A, may be in the upper build-up layers 152b, with the high-speed signal line 158 may be directly above it.

The high-speed signal line 158 together with the ground plane 162 forms a microstrip routing. This implementation does not increase the number of layers required in the substrate 152 as compared to substrate 102 of FIG. 1A. However, the high-speed signal line 158 is vulnerable to EMI/RFI signals 159 that may emanate from outside of legacy package 150. As a result, this may compromise the quality and/or speed that may be achieved in the high-speed signal line 158. An underfill 155 may be placed under the die 154. In implementations, the die 154 may be coupled to the package 152 using micro-bumps or solder balls.

Figure 2:
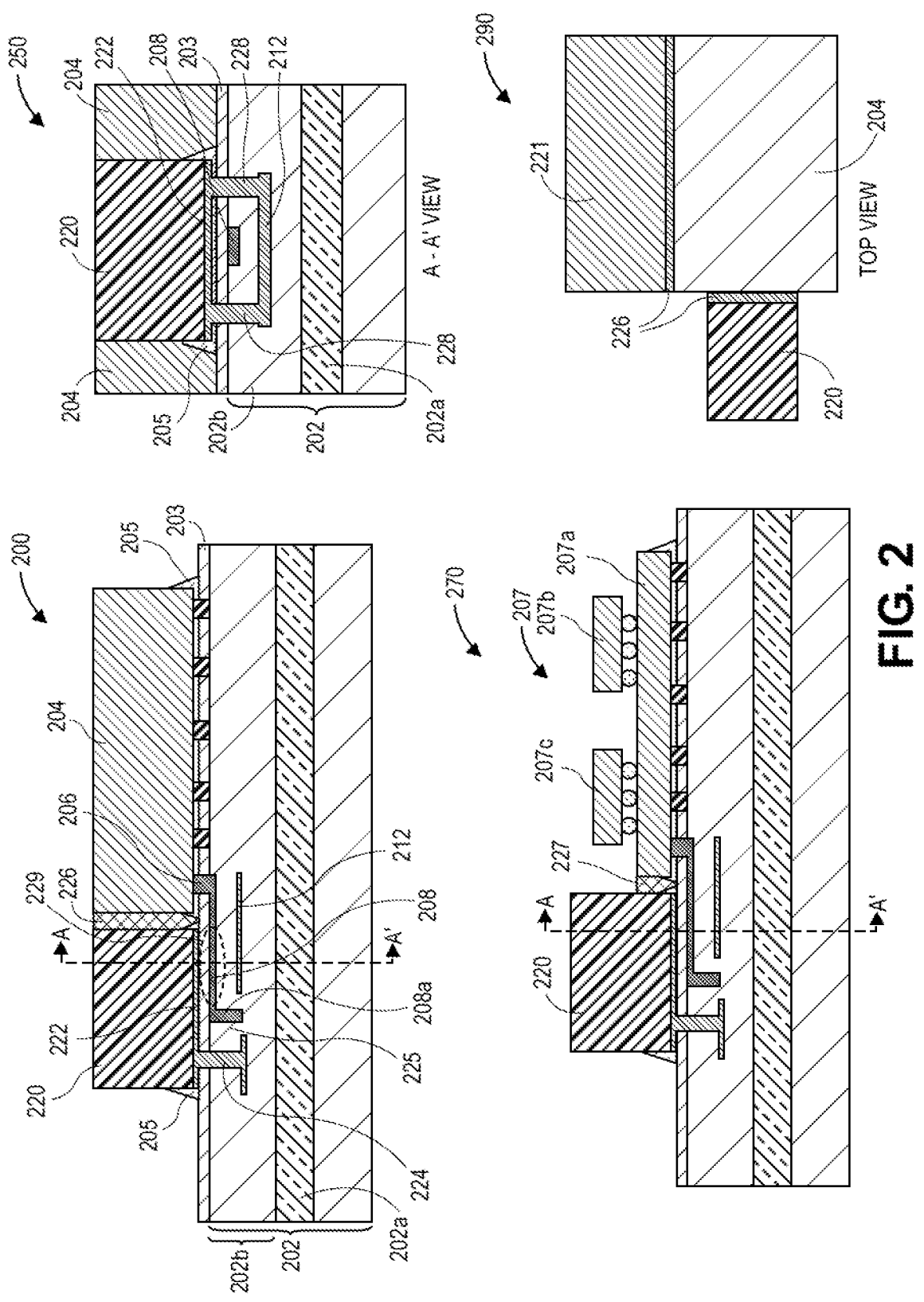
FIG. 2 illustrates cross section side views and a top-down view of a package that includes a strip line transmission line at a side of a substrate that is coupled with a die, with the transmission line between a ground plane of a second die and a ground plane in the substrate, in accordance with various embodiments.

FIG. 2 illustrates cross section side views and a top-down view of a package that includes a strip line transmission line at a side of a substrate that is coupled with a die, with the transmission line between a ground plane of a second die and a ground plane in the substrate, in accordance with various embodiments. Package 200 is a cross section side view that shows an embodiment that includes a substrate 202, that may have a core 202a and a upper build-up layer 202b, which may be similar to substrate 102, core 102a, and upper build-up layer 102b of FIG. 1A. In embodiments, the substrate 202 may be a multilayer organic package substrate. In embodiments, the core 202a may include glass, ceramic, photo definable glass, or copper clad laminate (CCL).

A die 204 may be coupled with a side of the substrate 202 using electrical connection 206, which in turn may be coupled with electrical routing 208. These may be similar to die 154, electrical connections 156, and signal line 158 of FIG. 1B. In embodiments, the electrical routing 208 may be a high-speed transmission line, which may also be referred to as a high-speed signal line or a high-speed trace. In embodiments, there may be a solder resist layer 203 on top of the substrate 202 and on top of the electrical routing 208.

In embodiments, the electrical routing 208 may be routed in a topmost metal layer of the substrate 202.

In embodiments, a secondary die 220 may be coupled with the substrate 202, and may be proximate and/or adjacent to the die 204. In embodiments, the secondary die 220 may be electrically coupled with the substrate 202 using first level interconnects such as solder bumps or copper pillars capped with solder. In embodiments, the secondary die 220 may be a silicon die, or may be some other die with a reduced number of layers, for example in order to reduce the overall cost of manufacturing of the package 200.

In embodiments, the secondary die 220 may include a ground plane 222, which may also be referred to as a reference plane. In embodiments, the ground plane 222 may be a copper plane that may couple with a ground 224 of the package substrate 202. In embodiments, the ground plane may include aluminum, gold, silver, or some other conductive material. In embodiments, the ground plane may be a solid or a mesh plane that has micro-bumps that connect to a ground plane of the package 200. In embodiments, the ground plane 222 may be at an edge of the secondary die 220 (as shown). In embodiments, there may be a passivation layer above, or may cover, the ground plane 222. In embodiments, a portion of the electrical routing 208 may pass underneath the ground plane 222.

In embodiments, a ground plane 212 may be included within the substrate 202, which may be similar to ground plane 162 within substrate 152 of FIG. 1B. In embodiments, ground plane 212 may be within the upper build-up layer 202b. In embodiments, all or part of the electrical routing 208 may be between the ground plane 222 of the secondary die 220, and the ground plane 212 within the substrate 202. In embodiments, the ground planes 212, 222 may be electrically coupled.

In particular, in region 229 a portion of the electrical routing 208 is between the ground plane 222 of the secondary die 220 and the ground plane 212 within the substrate 202. Within the region 229, a strip line structure is formed. In portions of electrical routing 208 that are outside region 229, a microstrip structure is formed. As a result of the combination of strip line structure and microstrip structure, electrical routing 208 may be enabled to transmit high-speed signals, which include high-frequency signals, for example above 10 Gbps, with high quality.

In embodiments, a breakout structure 225, where the electrical routing 208 along a surface of the substrate 202 electrically couples with a set of vertical vias 208a, may be under the ground plane 222 of the secondary die 220. In these embodiments, the ground plane 222 of the secondary die 220 may provide EMI/RFI shielding for the breakout structure 225. In embodiments, the breakout structure 225 may be referred to as a signal breakout.

In embodiments, a fill 226 may be placed between the secondary die 220 and the die 204. The fill 226 may include material that may be used to reduce the transmission of EMI/RFI between the secondary die 220 and the die 204. In embodiments, a gap between the die 204 and the secondary die 220 may range from 50 to 200 μm. In embodiments, depending upon the distance of the gap, and the frequency (wavelength) of the signal on the electrical routing 208, no fill 226 may be required, as the resulting EMI/RFI may not leak between the secondary die 220 and the die 204.

In embodiments, an underfill 205 may be placed underneath the secondary die 220 and the main die 204, which may also include material that may be used to reduce the transmission of EMI/RFI to the electrical routing 208. In embodiments, the fill 226 and the underfill 205 may also serve to reduce the EMI/RFI that is emitted by the electrical routing 208 during operation of the package 200, which may adversely affect other devices proximate to the package 200.

In embodiments, a combination of the fill 226, underfill 205, width of the electrical routing 208, and a height of the ground plane 222 from the electrical routing 208 may be selected to achieve desired impedance targets. In embodiments, a selection for what portions of the electrical routing 208 may be part of a microstrip structure or a strip line structure may be determined based upon signal congestion, and where it may be less pronounced. In embodiments, the secondary die 220 may not have a ground plane 222 above the electrical routing 208, and a die back metallization may be used instead, for example to form a ground plane on the surface of the secondary die 220 that is furthest away from the package substrate.

In other embodiments, where the secondary die 220 has no metal planes, the secondary die 220 may be heavily doped to achieve resistivity, for example of less than 1 Ohm·cm. At such doping levels, the EMI/RFI signals, such as EMI/RFI signals 159 of FIG. 1B, may not be able to penetrate the secondary die 220. In embodiments, the secondary die 220 may be attached to the package using a non-conductive die attach film.

Diagram 250 shows a cross section side view of package 200 along A-A' line, and includes die 204, secondary die 220, ground plane 222, electrical routing 208, and ground plane 212 within the substrate 202. In embodiments, a width or height of the electrical routing 208, as well the distance between the ground planes 212, 222, may be chosen based on desired signal transmission performance based upon expected frequencies and characteristic impedance during operation of the package 200, or other design considerations of the package 200.

In embodiments, electrically conductive vias 228 may be electrically coupled with the ground planes 212, 222 and may be disposed on either side of the electrical routing 208. In embodiments, these electrically conductive vias 228 may be plated or filled with an electrically conductive material, such as copper. In embodiments, the electrically conductive vias 228 may form a partial Faraday cage around at least part of the electrical routing 208 to provide additional protection against EMI/RFI and to also alleviate the crosstalk.

Package 270, which may be similar to package 200, shows an embodiment where a die complex 207 that includes dies 207a, 207b, 207c instead of die 204 as shown in package 200. In embodiments, the die complex 207 may include any die or packaging configuration that requires a high-speed communication to or from the die complex 207. In embodiments, the die complex 207 may be a Foveros™ architecture or a hybrid-bonded architecture. In embodiments, the die complex 207 may have a high that is the same as the secondary die 220. In embodiments, fill 227, which may be similar to fill 226 of package 200, may be adjusted in height depending upon the height of the die complex 207.

Diagram 290 is a top-down view of package 200, that includes the die 204, secondary die 220, and a second secondary die 221, which may be similar to secondary die 220. Secondary die 220 and second secondary die 221 are proximate to different sides of the die 204 and are able to facilitate high-speed signals along electrical routings, such as electrical routings 208, that come from multiple sides of the die 204. In embodiments, a fill 226 may be placed between the secondary die 220 and the die 204, and also between the second secondary die 221 and the die 204, to absorb EMI/RFI.

Figure 3:
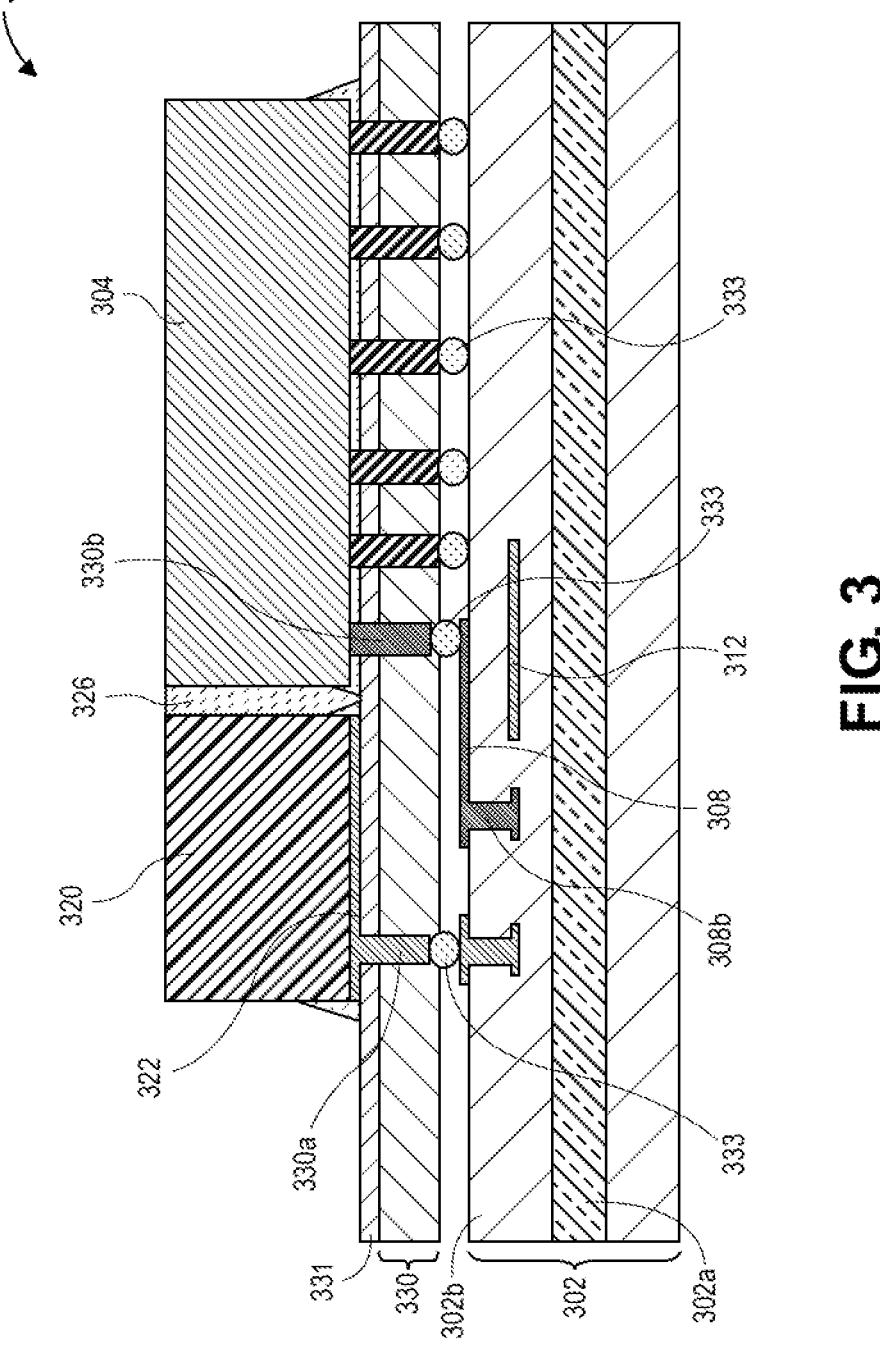
FIG. 3 illustrates a cross section side view of a package that includes a first and a second die coupled to an interconnect layer, that is coupled to a substrate that includes a strip line transmission line at a side of the substrate, in accordance with various embodiments.

FIG. 3 illustrates a cross section side view of a package that includes a first and a second die coupled to an interconnect layer, that is in turn coupled to a substrate that includes a strip line transmission line at a side of the substrate, in accordance with various embodiments. Package 300 includes a substrate 302 that may include a core 302a and an upper buildup layer 302b. The substrate 302 may be attached by an interconnect 330 using a ball grid array (BGA) 333. In embodiments, the interconnect 330 may be similar to an Omnidirectional Interconnect™ (ODI) from Intel. Interconnect 330 may include a mold layer, vias 330a, 330b as copper pillars or through mold vias going through the mold. Interconnect 330 may further include active and/or passive dies (not shown) embedded inside the molded layers. Those embedded dies may be connected electrically to die 304 and other dies in the complex. A solder resist layer 331 may be on top of the interconnect 330.

A die 304, that may be similar to die 204 of FIG. 2, may be coupled with the interconnect 330, and a secondary die 320, which may be similar to secondary die 220 of FIG. 2, may also be coupled with the interconnect 330. A fill 326, which may be similar to fill 226 of FIG. 2, may be placed between the secondary die 320 and the die 304. The secondary die 320 may include a ground plane 322 that may be on or near a side of the secondary die 320. In embodiments, one or more vias, such as vias 330a, 330b, may be formed in the interconnect 330 to allow electrical coupling with the substrate 302 using the BGA 333. In the embodiment shown, the interconnect 330 does not have a redistribution layer (RDL).

In embodiments, a ground plane 312 may be placed within the substrate 302, which may be similar to ground plane 212 in substrate 202 of FIG. 2. In embodiments, electrical routings 308 may be placed on a surface of the substrate 302, and may be connected with the die 304 through electrically conductive via 330b. In embodiments, a breakout may be formed by electrically coupling the vertical vias 308b, which may be similar to vertical vias 208a, with the electrical routing 308. In embodiments, at least a portion of the electrical routing 308 may be between the ground plane 322 of the secondary die 320 and the ground plane 312 of the substrate 302. In embodiments there may be a die (not shown) within the interconnect 330 that may be bonded to die 304 and extends into a cavity (not shown) within the interconnect 330.

Figure 4:
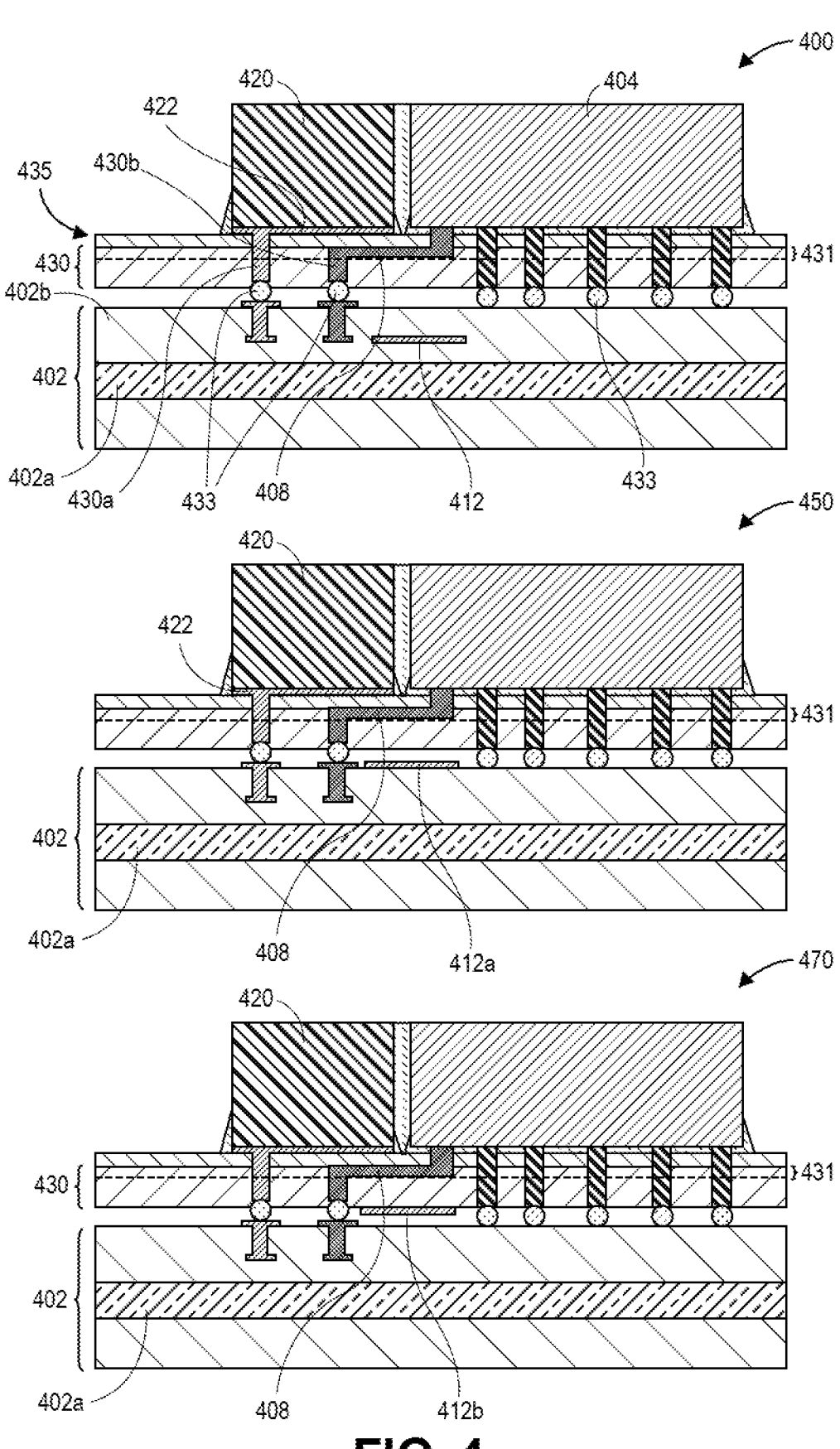
FIG. 4 illustrates cross section side views of packages that includes a first and a second die coupled to an interconnect layer that includes a strip line transmission line, in accordance with various embodiments.

FIG. 4 illustrates cross section side views of packages that includes a first and a second die coupled to an interconnect layer that includes a strip line transmission line, in accordance with various embodiments. Package 400, which may be similar to package 300 of FIG. 3, includes a substrate 402 that may include a core 402a and an upper buildup layer 402b. The substrate 402 may be attached by an interconnect 430 using a BGA 433. These may be similar to substrate 302, core 302a, upper buildup layer 302b, interconnect 330, and BGA 333 of FIG. 3.

However, unlike interconnect 330 of FIG. 3, interconnect 430 may include a redistribution layer 431 on a surface of the interconnect 430. In embodiments, the redistribution layer 431 may include electrical routings, including electrical routing 408, which may be similar to electrical routing 208 of FIG. 2. A solder resist layer 435 may be on the redistribution layer 431.

A die 404, that may be similar to die 304 of FIG. 3, may be coupled with the interconnect 430. A secondary die 420, which may be similar to secondary die 320 of FIG. 3, may also be coupled with the interconnect 430. The secondary die 420 may include a ground plane 422 that may be at or proximate to a side of the secondary die 420. In embodiments, the electrical routing 408 may be electrically coupled with the die 404, and at least part of the electrical routing 408 will pass underneath the secondary die 420 and the ground plane 422.

In embodiments, one or more vias, such as vias 430a, 430b may be formed in the interconnect 430 to allow electrical coupling between the redistribution layer 431 and the substrate 402, using BGA 433. In embodiments, a ground plane 412 may be placed within the substrate 402, which may be similar to ground plane 312 and substrate 302 of FIG. 2. In embodiments, at least a portion of the electrical routing 408 may be between the ground plane 422 of the secondary die 420 and the ground plane 412 of the substrate 402. As a result, a strip line transmission structure may be formed.

Package 450, which may be similar to package 400, shows an embodiment where the ground plane 412 of the substrate 402 as shown in package 400 has been changed. Ground plane 412a, which is similar to ground plane 412, is placed on a surface of the substrate 402. The electrical routing 408 is at least partially between the ground plane 422 of the secondary die 420 and the ground plane 412a. Package 470, which may be similar to package 400 or package 450, shows a position of the ground plane 412b on a surface of the interconnect 430. The electrical routing 408 is at least partially between the ground plane 422 of the secondary die 420 and the ground plane 412b. The embodiment shown in package 470 reduces the number of package substrate layers that is required within substrate 402 because the ground plane 412b is not needed within the substrate 402. As a result, in package 450 and package 470, a strip line transmission structure may be formed. In embodiments, the core 402a of the substrate 402 may include glass, ceramic, photo definable glass, or copper clad laminate (CCL).

Figure 5:
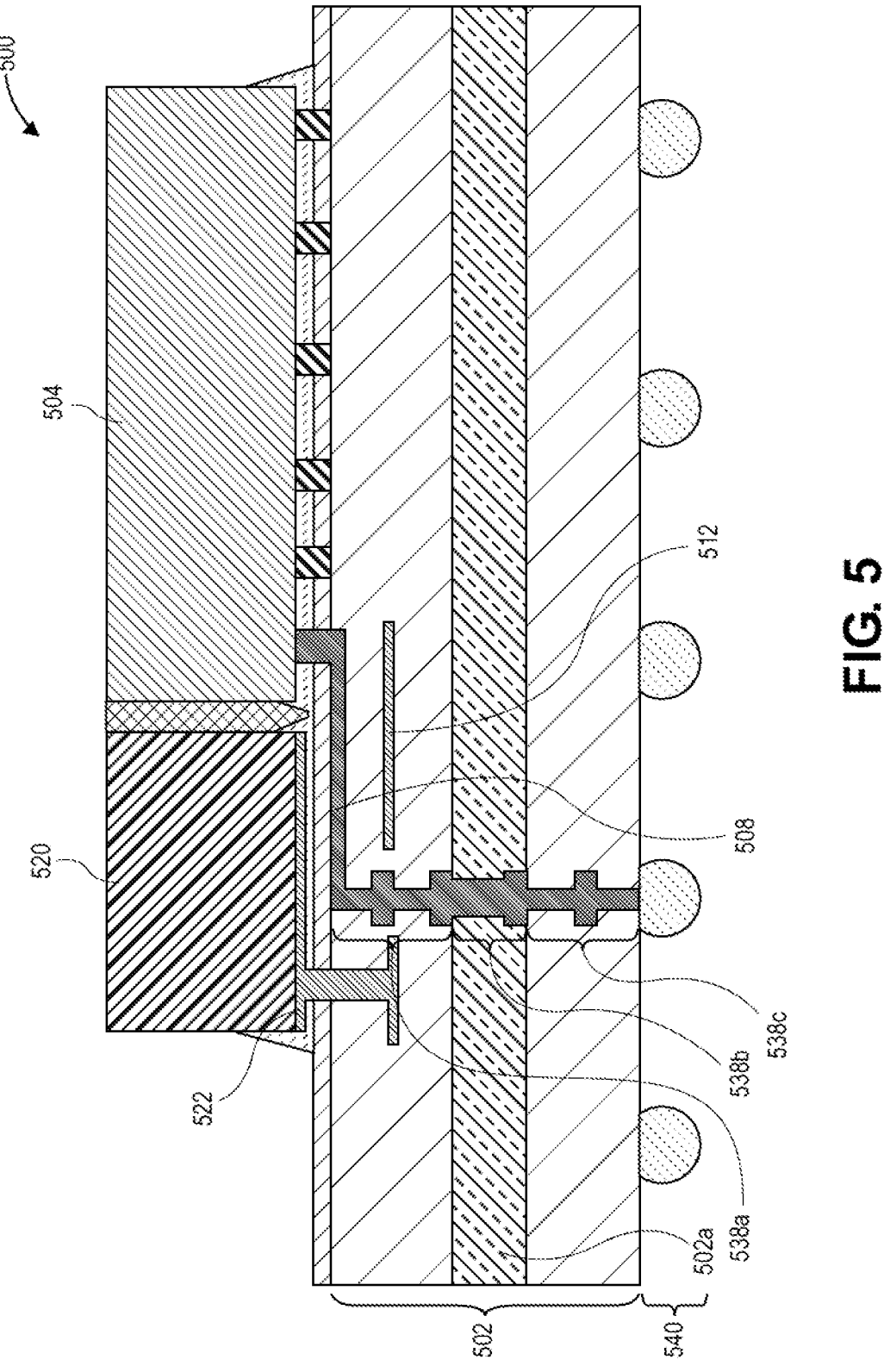
FIG. 5 illustrates a cross section side view of a package that includes a first and a second die coupled to a first side of a substrate that includes a strip line transmission line that is routed to the second side of the substrate in a shielded breakout, in accordance with various embodiments.

FIG. 5 illustrates a cross section side view of a package that includes a first and a second die coupled to a first side of a substrate that includes a strip line transmission line that is routed to the second side of the substrate in a shielded breakout, in accordance with various embodiments. Package 500 includes a secondary die 520 with a ground plane 522, and electrical routing 508 that is electrically coupled with the die 504. These may be similar to secondary die 320 with a ground plane 322, electrical routing 308 and die 304 of FIG. 3. The electrical routing 508 is at least partially between the ground plane 522 of the secondary die 520 and a ground plane 512 within substrate 502.

The electrical routing 508 may electrically couple with a breakout that includes a first set of vias 538a, a through hole via 538b that extends through the core 502a, and a second set of vias 538c, that may be used to electrically couple the electrical routing 508 with a second level interconnect (SLI) 540 on a side of the substrate 502. In embodiments, the SLI 540 may be a BGA. In this embodiment, the ground plane 522 of the secondary die 520 provides EMI/RFI shielding for the breakout.

Figure 6:
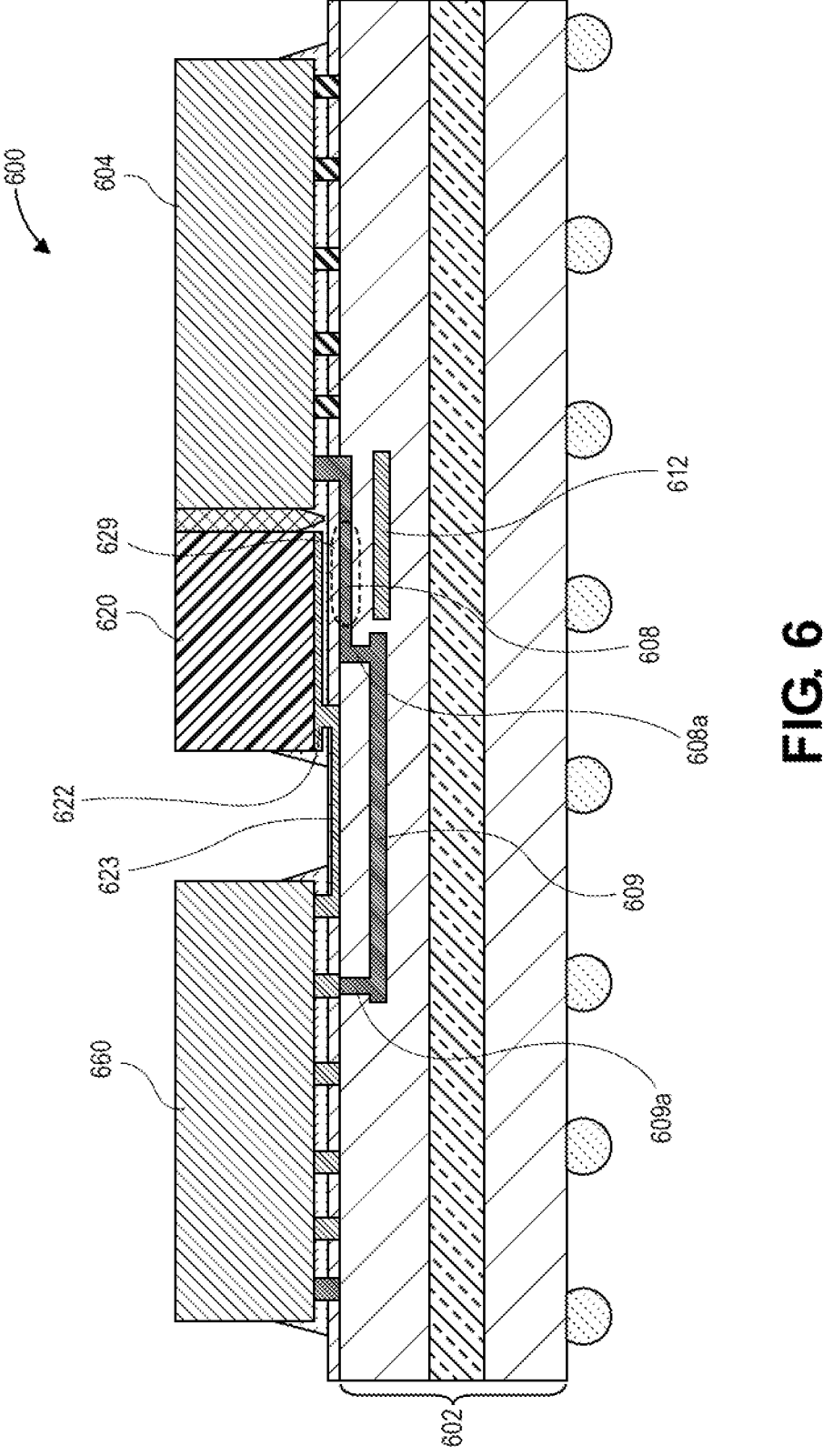
FIG. 6 illustrates a cross section side view of a package that has multiple dies that are electrically coupled with a strip line transmission line on a surface of the substrate, in accordance with various embodiments.

FIG. 6 illustrates a cross section side view of a package that has multiple dies that are electrically coupled with a strip line transmission line on a surface of the substrate, in accordance with various embodiments. Package 600, which may be similar to package 500 of FIG. 5, shows a first die 604 and a secondary die 620, which may be similar to die 504 and secondary die 520 of FIG. 5. A second die 660 may also be placed on the surface of the substrate 602. In embodiments, the first die 604 may be a compute die, and the second die 660 may be a memory chip or a memory die, where high-quality, high-speed signals are to be routed between the first die 604 and the second die 660.

In embodiments, a ground plane 622, which may be similar to ground plane 522 of FIG. 5, is a part of secondary die 620. In embodiments, a ground plane 612, which may be similar to ground plane 512 of FIG. 5, may be placed within the substrate 602. In embodiments, the first die 604 may be electrically coupled with a first electrical routing 608, a part of which may be between the ground plane 612 of the substrate 602 and the ground plane 622 of the secondary die 620 in region 629, forming a strip line structure.

A second electrical routing 609 may be electrically coupled to the first electrical routing 608 using via 608a, which allows the second electrical routing 609 to be in a deeper layer within the substrate 602. In embodiments, part of the second electrical routing 609 may be underneath the ground plane 622 of the secondary die 620, forming a microstrip structure. In embodiments, another ground plane 623 at the surface of the substrate 602 may be at least partially above the second electrical routing 609, forming another microstrip structure. The second electrical routing 609 may electrically couple with the second die 660 using via 609a.

In this embodiment, a portion of the first electrical routing 608 that is between the ground plane 622 and the ground plane 612 may perform like a strip line transmission line, and a portion of the second electrical routing 609 underneath the ground plane 623 may perform like a microstrip transmission line. In embodiments, the second electrical routing 609 may encounter less EMI/RFI at a lower level within the substrate 602, as opposed to being at or near the surface of the substrate 602 without any ground plane shielding. Although the ground plane 623 may mitigate external EMI/RFI, in some embodiments (not shown) an additional ground plane may still be placed below the second electrical routing 609 to further mitigate crosstalk and control impedance, and therefore enable high quality signal transmission even at high frequencies.

In these embodiments, the techniques described above may be used to route high speed transmission lines from a compute die such as die 604 that has a finer pitch, to a storage die such as second die 660 that may have a wider pitch. Microstrips and/or strip lines that may be formed using the ground plane 622 of the secondary die 620 may be used to spread out high-speed transmission lines from the compute die.

FIG. 7 illustrates an example process for creating a package that includes a substrate with a strip line transmission line electrically coupled with a first die, where at least a portion of the strip line is between a ground plane in the substrate and a ground plane in a second die proximate to the first die, in accordance with various embodiments.

At block 702, the process may include providing a substrate, wherein the substrate includes an electrical routing on a surface of the substrate, wherein the substrate includes a ground plane that is substantially parallel to the surface of the substrate, and wherein the electrical routing is part of a strip line transmission line. In embodiments, the substrate may be similar to substrate 202 of FIG. 2, substrate 502 of FIG. 5, or substrate 602 of FIG. 6. In embodiments, the electrical routing may be similar to electrical routing 208 of FIG. 2, electrical routing 508 of FIG. 5, or electrical routings 608, 609 of FIG. 6. In embodiments, the ground plane may be similar to ground plane 212 of FIG. 2, ground plane 512 of FIG. 5, or ground plane 612 of FIG. 6.

At block 704, the process may further include coupling a first die to the surface of the substrate, wherein the first die is electrically coupled with the electrical routing. In embodiments, the first die may be similar to first die 204 of FIG. 2, first die 504 of FIG. 5, or first die 604 of FIG. 6.

At block 706, the process may further include coupling a second die to the surface of the substrate, wherein the second die includes a ground plane that is substantially parallel to the surface of the substrate, and wherein at least a portion of the electrical routing is between the ground plane of the second die and the ground plane of the substrate. In embodiments, the second die and the ground plane may be similar to secondary die 220 and ground plane 222 of FIG. 2, secondary die 320 and ground plane 322 of FIG. 3, secondary die 520 and ground plane 522 of FIG. 5, and secondary die 620 and ground plane 622 of FIG. 6.

Figure 8:
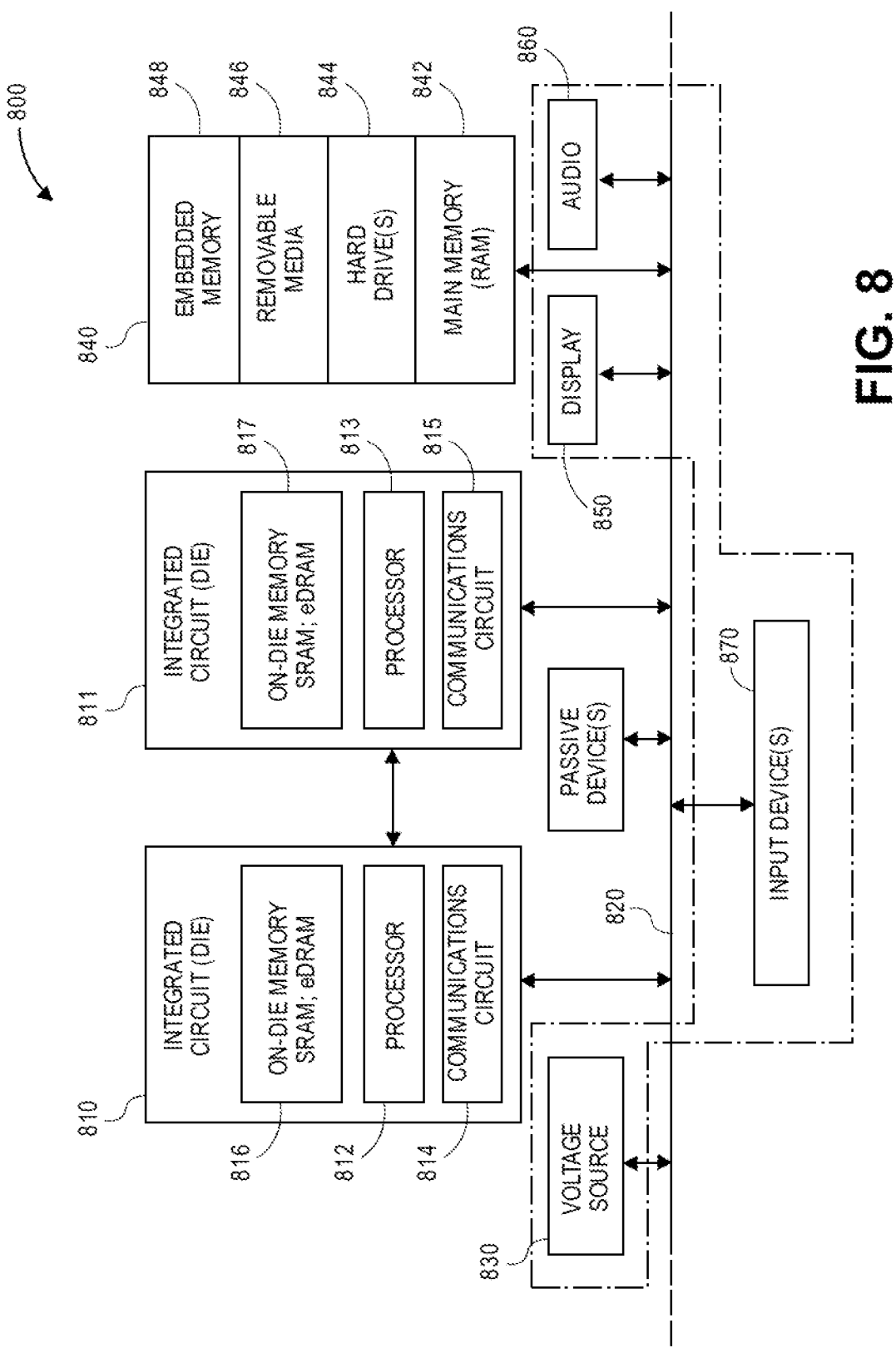
FIG. 8 schematically illustrates a computing device, in accordance with various embodiments.

FIG. 8 is a schematic of a computer system 800, in accordance with an embodiment of the present invention. The computer system 800 (also referred to as the electronic system 800) as depicted can embody a secondary die with a ground plane for strip line routing, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a secondary die with a ground plane for strip line routing, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having a secondary die with a ground plane for strip line routing, according to any of the several disclosed embodiments and their equivalents, an electronic system, a computer system, one or more methods of fabricating an integrated circuit, and one or more methods of fabricating an electronic assembly that includes a package substrate having a secondary die with a ground plane for strip line routing, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a secondary die with a ground plane for strip line routing embodiments and their equivalents. A foundation substrate may be included, as represented by the dashed line of FIG. 8. Passive devices may also be included, as is also depicted in FIG. 8.

EXAMPLES

The following paragraphs describe examples of various embodiments.

Example 1 is a package comprising: a substrate; a first die on a side of the substrate; a second die on the side of the substrate, wherein the second die is adjacent to the first die, and wherein the second die includes a ground plane; and an electrical routing on the substrate at or proximate to the side of the substrate, wherein the electrical routing is electrically coupled with the first die, and wherein the electrical routing extends at least partially under the ground plane of the second die.

Example 2 includes the package of example 1, or of any other example or embodiments herein, wherein the substrate includes a ground plane, wherein the electrical routing on the substrate is at least partially between the ground plane of the second die and the ground plane of the substrate.

Example 3 includes the package of example 2, or of any other example or embodiments herein, wherein the ground plane of the substrate is electrically coupled with the ground plane of the second die.

Example 4 includes the package of example 2, or of any other example or embodiments herein, wherein the ground plane of the second die is at a side of the second die.

Example 5 includes the package of example 2, or of any other example or embodiments herein, further comprising underfill material disposed at least partially underneath the first die and at least partially under the second die, the underfill material at least partially covering the electrical routing.

Example 6 includes the package of example 5, or of any other example or embodiments herein, further comprising a fill disposed between the first die and the second die, wherein the fill includes material to reduce electromagnetic interference (EMI) or radio frequency interference (RFI) passing through the fill.

Example 7 includes the package of example 2, or of any other example or embodiments herein, further comprising: a plurality of electrically conductive features in the substrate, the plurality of electrically conductive features substantially perpendicular to the side of the substrate, wherein the plurality of electrically conductive features are electrically coupled with the ground plane of the substrate and the ground plane of the second die; and wherein a first portion of the plurality of electrically conductive features are on a first side of the electrical routing, and wherein a second portion of the plurality of electrically conductive features are on a second side of the electrical routing opposite the first side.

Example 8 includes the package of example 2, or of any other example or embodiments herein, wherein the side of the substrate is a first side of the substrate, and wherein the electrical routing is a first electrical routing; and further comprising: a second electrical routing within the substrate, the second electrical routing electrically and physically coupled with the first electrical routing, the second electrical routing extending from the first electrical routing for the second side of the substrate opposite the first side of the substrate; and wherein the second electrical routing and the first electrical routing are physically coupled at a location that is between the ground plane of the second die and the second side of the substrate.

Example 9 includes the package of example 2, or of any other example or embodiments herein, wherein the substrate includes a glass core.

Example 10 includes the package of example 2, or of any other example or embodiments herein, wherein the electrical routing is a strip line transmission line.

Example 11 includes the package of example 2, or of any other example or embodiments herein, wherein the first die is a die complex.

Example 12 is a package comprising: an interconnect with a first side and a second side opposite the first side; a first die on the first side of the interconnect and electrically coupled with the interconnect; a second die on the first side of the interconnect, wherein the second die is adjacent to the first die, and wherein the second die includes a ground plane; and wherein the interconnect includes an electrical routing, wherein the electrical routing is electrically coupled with the first die, and wherein at least a portion of the electrical routing extends underneath the ground plane of the second die.

Example 13 includes the package of example 12, or of any other example or embodiments herein, wherein the interconnect further includes a ground plane, wherein at least a portion of the electrical routing is between the ground plane of the second die and the ground plane of the interconnect.

Example 14 includes the package of example 13, or of any other example or embodiments herein, wherein the ground plane of the interconnect is on the second side of the interconnect.

Example 15 includes the package of example 13, or of any other example or embodiments herein, wherein the ground plane of the interconnect is electrically coupled with the ground plane of the second die.

Example 16 includes the package of example 12, or of any other example or embodiments herein, further comprising: a substrate coupled with the second side of the interconnect, wherein the substrate includes a ground plane, wherein at least a portion of the electrical routing is between the ground plane of the second die and the ground plane of the substrate.

Example 17 includes the package of example 16, or of any other example or embodiments herein, wherein the ground plane of the substrate is at a side of the substrate proximate to the second side of the interconnect.

Example 18 includes the package of example 12, or of any other example or embodiments herein, further comprising a fill disposed between the first die and the second die, wherein the fill includes material to reduce electromagnetic interference (EMI) or radio frequency interference (RFI) passing through the fill.

Example 19 includes the package of example 12, or of any other example or embodiments herein, wherein the ground plane of the second die is adjacent to the first side of the interconnect.

Example 20 includes the package of example 12, or of any other example or embodiments herein, wherein the first die and the second die are separated by a distance of less than 100 μm.

Example 21 includes the package of example 12, or of any other example or embodiments herein, wherein the electrical routing is a part of a strip line transmission line.

Example 22 includes the package of example 12, or of any other example or embodiments herein, wherein the second die is a passive silicon die.

Example 23 is a method comprising: providing a substrate, wherein the substrate includes an electrical routing on a surface of the substrate, wherein the substrate includes a ground plane that is substantially parallel to the surface of the substrate, and wherein the electrical routing is part of a strip line transmission line; coupling a first die to the surface of the substrate, wherein the first die is electrically coupled with the electrical routing; and coupling a secondary die to the surface of the substrate, wherein the secondary die includes a ground plane that is substantially parallel to the surface of the substrate, and wherein at least a portion of the electrical routing is between the ground plane of the secondary die and the ground plane of the substrate.

Example 24 includes the method of example 23, or of any other example or embodiments herein, further comprising inserting a fill material between the first die and the secondary die, wherein the fill includes material that reduces electromagnetic interference (EMI) or radio frequency interference (RFI) passing through the fill.

Example 25 includes the method of example 23, or of any other example or embodiments herein, wherein the secondary die is a passive silicon die, and wherein the first die and the secondary die are separated by a distance of less than 100 μm.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A package comprising:
a substrate;
a first die on a side of the substrate;
a second die on the side of the substrate, wherein the second die is adjacent to the first die, and wherein the second die includes a ground plane; and
an electrical routing on the substrate at or proximate to the side of the substrate, wherein the electrical routing is electrically coupled with the first die, wherein the electrical routing extends at least partially under the ground plane of the second die, wherein the substrate includes a ground plane, and wherein the electrical routing on the substrate is at least partially vertically between the ground plane of the second die and the ground plane of the substrate along a vertical axis through the ground plane of the second die and the ground plane of the substrate.

2. The package of claim 1, wherein the ground plane of the substrate is electrically coupled with the ground plane of the second die.

3. The package of claim 1, wherein the ground plane of the second die is at a side of the second die.

4. The package of claim 1, further comprising underfill material disposed at least partially underneath the first die and at least partially under the second die, the underfill material at least partially covering the electrical routing.

5. The package of claim 4, further comprising a fill disposed between the first die and the second die, wherein the fill includes material to reduce electromagnetic interference (EMI) or radio frequency interference (RFI) passing through the fill.

6. The package of claim 1, further comprising:
a plurality of electrically conductive features in the substrate, the plurality of electrically conductive features substantially perpendicular to the side of the substrate, wherein the plurality of electrically conductive features are electrically coupled with the ground plane of the substrate and the ground plane of the second die; and wherein a first portion of the plurality of electrically conductive features are on a first side of the electrical routing, and wherein a second portion of the plurality of electrically conductive features are on a second side of the electrical routing opposite the first side.

7. The package of claim 1, wherein the side of the substrate is a first side of the substrate, and wherein the electrical routing is a first electrical routing; and further comprising:

a second electrical routing within the substrate, the second electrical routing electrically and physically coupled with the first electrical routing, the second electrical routing extending from the first electrical routing for a second side of the substrate opposite the first side of the substrate; and wherein the second electrical routing and the first electrical routing are physically coupled at a location that is between the ground plane of the second die and the second side of the substrate.

8. The package of claim 1, wherein the substrate includes a glass core.

9. The package of claim 1, wherein the electrical routing is a strip line transmission line.

10. The package of claim 1, wherein the first die is a die complex.

11. A package comprising:

an interconnect with a first side and a second side opposite the first side;

a first die on the first side of the interconnect and electrically coupled with the interconnect;

a second die on the first side of the interconnect, wherein the second die is adjacent to the first die, and wherein the second die includes a ground plane; and wherein the interconnect includes an electrical routing, wherein the electrical routing is electrically coupled with the first die, wherein at least a portion of the electrical routing extends underneath the ground plane of the second die, wherein the interconnect further includes a ground plane, and wherein at least a portion of the electrical routing is vertically between the ground plane of the second die and the ground plane of the interconnect along a vertical axis through the ground plane of the second die and the ground plane of the interconnect.

12. The package of claim 11, wherein the ground plane of the interconnect is on the second side of the interconnect.

13. The package of claim 11, wherein the ground plane of the interconnect is electrically coupled with the ground plane of the second die.

14. The package of claim 11, further comprising:

a substrate coupled with the second side of the interconnect, wherein the substrate includes a ground plane, wherein at least a portion of the electrical routing is between the ground plane of the second die and the ground plane of the substrate.

15. The package of claim 14, wherein the ground plane of the substrate is at a side of the substrate proximate to the second side of the interconnect.

16. The package of claim 11, further comprising a fill disposed between the first die and the second die, wherein the fill includes material to reduce electromagnetic interference (EMI) or radio frequency interference (RFI) passing through the fill.

17. The package of claim 11, wherein the ground plane of the second die is adjacent to the first side of the interconnect.

18. The package of claim 11, wherein the first die and the second die are separated by a distance of less than 100 µm.

19. The package of claim 11, wherein the electrical routing is a part of a strip line transmission line.

20. The package of claim 11, wherein the second die is a passive silicon die.

21. A method comprising:

providing a substrate, wherein the substrate includes an electrical routing on a surface of the substrate, wherein the substrate includes a ground plane that is substantially parallel to the surface of the substrate, and wherein the electrical routing is part of a strip line transmission line;

coupling a first die to the surface of the substrate, wherein the first die is electrically coupled with the electrical routing; and coupling a secondary die to the surface of the substrate, wherein the secondary die includes a ground plane that is substantially parallel to the surface of the substrate, and wherein at least a portion of the electrical routing is vertically between the ground plane of the secondary die and the ground plane of the substrate along a vertical axis through the ground plane of the secondary die and the ground plane of the substrate.

22. The method of claim 21, further comprising inserting a fill material between the first die and the secondary die, wherein the fill includes material that reduces electromagnetic interference (EMI) or radio frequency interference (RFI) passing through the fill.

23. The method of claim 21, wherein the secondary die is a passive silicon die, and wherein the first die and the secondary die are separated by a distance of less than 100 µm.

* * * * *